United States Patent [19]

Rainone

[11] 4,145,730
[45] Mar. 20, 1979

[54] FLASH LAMP ARRAY HAVING A POSITIVELY ACTING FLASH SENSING INDICATOR

[75] Inventor: Nicholas J. Rainone, Clifton, N.J.

[73] Assignee: Westinghouse Electric Corp., Pittsburgh, Pa.

[21] Appl. No.: 864,309

[22] Filed: Dec. 27, 1977

[51] Int. Cl.$^2$ ............................................. G03B 15/02
[52] U.S. Cl. ....................................... 362/10; 362/13; 362/247
[58] Field of Search ............................ 362/10, 13, 247

[56] References Cited

U.S. PATENT DOCUMENTS 4,017,728   4/1977   Audesse et al. ...................... 362/13

Primary Examiner—Stephen J. Lechert, Jr.
Attorney, Agent, or Firm—R. S. Lombard

[57] ABSTRACT

A flash lamp array including a plurality of flash lamps and sequencing electrical circuitry for sequentially flashing the lamps. The array comprises a flash sensing indicator that is readily observable by an operator of the flash lamp array and includes a generally flat radiation sensitive means and having sections thereof aligned with the flash lamps. Each radiation-sensitive section is positioned to receive some of the radiant energy emitted by the flashing of one of the aligned lamps and is operable to constrict and change appearance upon being irradiated to provide an indicia of such flashing. The radiation-sensitive sections are each provided with a structurally weakened portion so that upon irradiation by the flashing of one of the aligned lamps, the irradiated one of the radiation-sensitive sections will readily separate at the structurally-weakened portion to readily constrict upon itself to positively provide a desired change in appearance of the irradiated section.

8 Claims, 5 Drawing Figures

U.S. Patent  Mar. 20, 1979  Sheet 2 of 2  4,145,730

FLASH LAMP ARRAY HAVING A POSITIVELY ACTING FLASH SENSING INDICATOR

BACKGROUND OF THE INVENTION

This invention relates to flash lamp arrays and, more particularly, to a flash lamp array having a flash sensing indicator included therewith. One such array described in U.S. Pat. No. 4,053,757 dated Oct. 11, 1977, issued to Richard Blount, discloses a flash lamp array comprising a plurality of flash lamps and a flash indicator having heat-sensitive plastic that upon being irradiated by flash lamps, shrinks or melts away thereby changing appearance and indicating to the operator of the array that that flash lamp has been used. Problems may be encountered with flash indicators in that the radiation from a flashed lamp may be insufficient to melt or shrink the radiation-sensitive material.

SUMMARY OF THE INVENTION

The present improvement is provided in combination with a flash lamp array including a plurality of flash lamps and sequencing electrical circuitry for sequentially flashing the lamps. The array further includes a two-sided circuit board having the sequencing circuitry affixed to one side thereof. The lamps are positioned in close proximity to the one side of the circuit board. The circuit board is provided with windows therethrough, each in alignment with one of the lamps to permit the passage of radiant energy upon the flashing of the aligned lamp.

The improvement comprises a flash sensing indicator in close proximity to the other side of the circuit board and readily observable by an operator of the flash lamp array. The flash sensing indicator comprises an opaque non-reactive member having apertures provided therein each in alignment with one of the windows provided in the circuit board. The flash sensing indicator further includes a generally flat radiation sensitive means affixed to one side of the opaque non-reactive member nearest the circuit board. The radiation sensitive means have sections overlaying the apertures provided in the non-reactive member. Each of the overlaying radiation-sensitive sections is operable to receive some of the radiant energy emitted by the flashing of one of the aligned lamps and is operable to constrict and change appearance upon being irradiated to provide an indicia of such flashing.

The overlaying radiation-sensitive sections are each provided with a structurally weakened portion substantially traversing a lateral dimension of one of the overlaying radiation-sensitive sections so that upon irradiation of the flashing of one of the aligned lamps, the irradiated one of the overlaying radiation-sensitive sections will readily separate at the structurally weakened portion to readily constrict upon itself to positively provide the desired change in appearance of the irradiated overlaying section.

BRIEF DESCRIPTION OF THE DRAWINGS

For a better understanding of the invention, reference may be had to the preferred embodiment, exemplary of the invention, shown in the accompanying drawings, in which.

DESCRIPTION OF THE PREFERRED EMBODIMENTS

Figure 1:
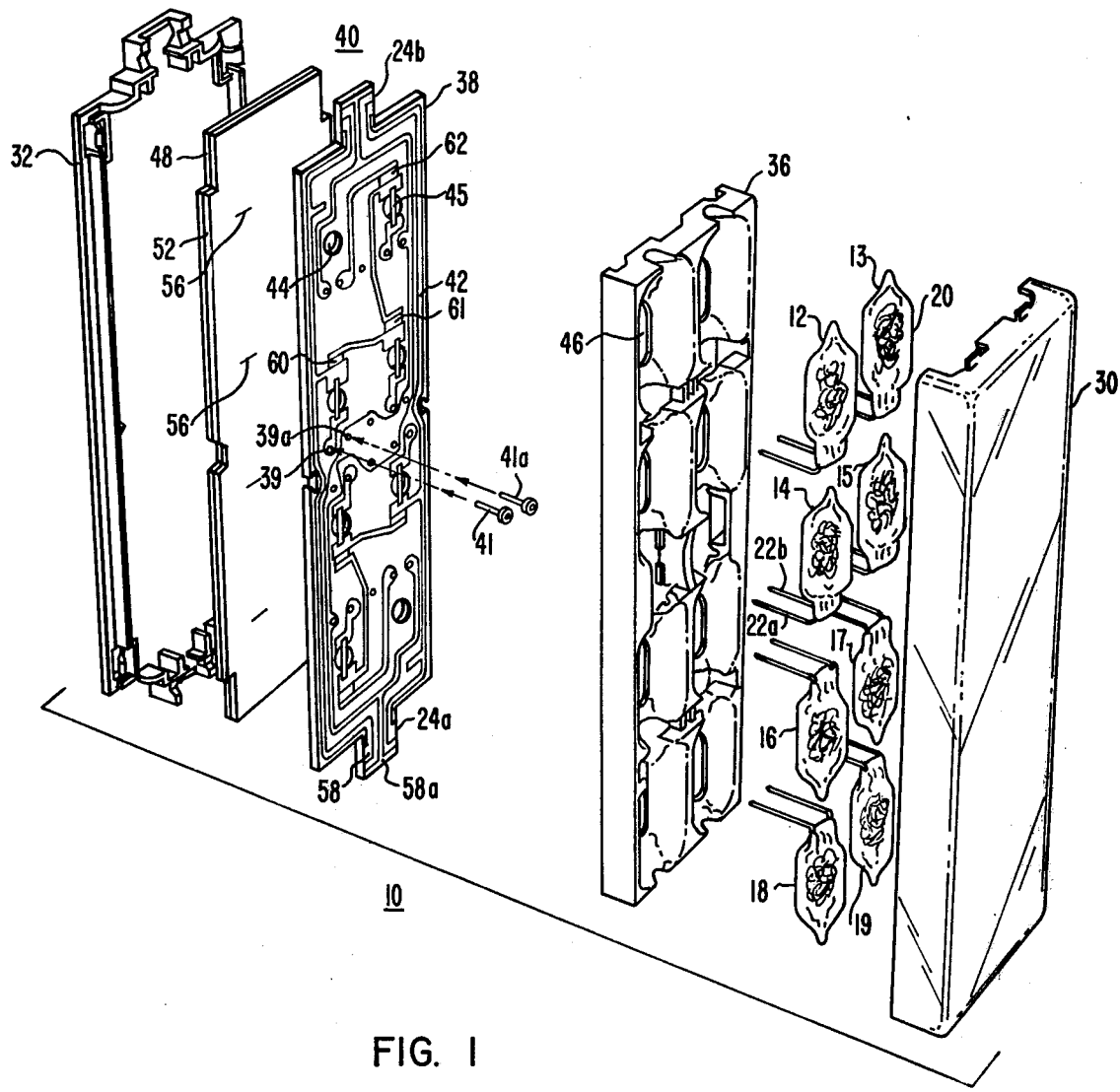
FIG. 1 is an exploded isometric view of a typical flash lamp array showing the internal parts.
Figure 2:
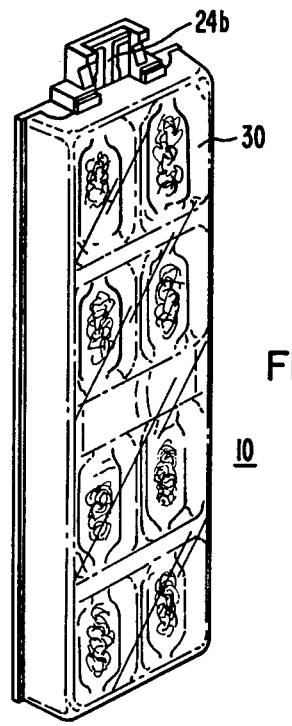
FIG. 2 is an isometric view showing the front portion of the flash lamp array.

FIGS. 1 and 2 show a typical flash lamp array 10 including a plurality of electrically fired flash lamps 12-19 each having a tubular-shaped vitreous envelope 20 hermetically sealed to a pair of lead-in wires 22a, 22b. The lamp array 10 is provided with a plug-in connector tab 24a at the lower side or end thereof, adapted to be mountable in a socket of a camera or flash adaptor. The lamp array 10 is also provided with a second plug-in connector tab 24b at the upper side or end thereof, whereby the array 10 can be mounted in a camera socket by either tab 24 or 24a to fire all of the lamps, as is conventional in such a design. The array 10 comprises an upper group of flash lamps 12, 13, 14, 15 and a lower group of flash lamps 16, 17, 18 and 19, the lamps being arranged in a planar configuration. When the lamps are mounted in a camera socket by the tab 24a, only the upper group of the lamps will be flashed; likewise, when the array is mounted in a camera socket by tab 24b, only the lower group (now in the uppermost position) will be flashed. With this arrangement having only the lamps relatively far from the lamp's axis being flashable, the undesirable "red eye" effect will be reduced, as is well known in the art.

The array 10 also includes a front cover member 30 for covering the flash lamps which is normally made of light transmitting plastic and the rear cover member 32 which is also normally made of the same material. The front cover member 30 and the rear cover member 32 are affixed to each other by any suitable means, such as with glue. Between the front cover member 30 and the rear cover member 32, in the following order, are the flash lamps 12-19, reflector member 36 for reflecting light from the flash lamps toward the front cover member 30, a two-sided circuit board 38 provided with the integral connector tabs 24a, 24b, and a flash sensing indicator 40.

The two-sided circuit board 38 has affixed to one side thereof nearest the reflector member 36 sequencing circuitry 42 having the lead-in wires 22a, 22b connected in circuit therewith for automatically flashing the lamps in each group in a predetermined sequence. The lamps 12-19 are positioned in close proximity to the one side of the circuit board 38. The circuit board 38 is provided with windows 44 therethrough, each in alignment with one of the lamps 12-19 to permit the passage of radiant energy upon the flashing of each of the aligned lamps. The lead-in wires 22a, 22b may be electrically connected to the sequencing circuitry 42 by any suitable means such as providing the circuit board 38 with holes 39, 39a into which metallic eyelets 41, 41a are inserted. The lead-in wires 22a, 22b are of sufficient length to extend through the eyelets 41, 41a. The eyelets are then crimped thereby electrically connecting the lead-in wires 22a, 22b to the sequencing circuitry 42. The reflector 36 also has openings 46 provided therein in alignment with the windows 44 and the lamps 12-19.

Figure 3:
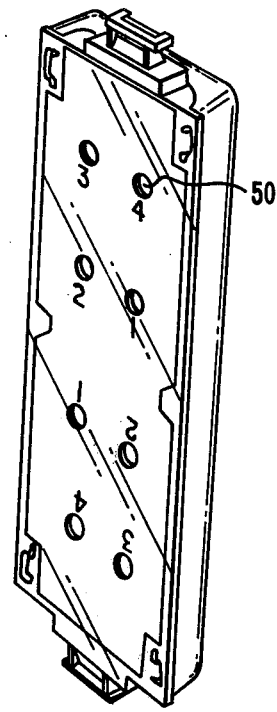
FIG. 3 is an isometric view showing the rear portion of the flash lamp array.
Figure 4:
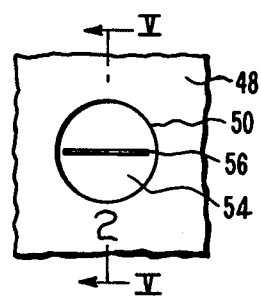
FIG. 4 is a fragmentary enlargement of part of the flash sensing indicator.
Figure 5:
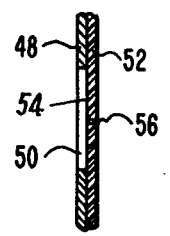
FIG. 5 is a cross-sectional view taken on the line V—V of FIG. 4.

The flash sensing indicator 40 is in close proximity to the other side of the circuit board 38 and is readily observable by an operator of the flash lamp array 10 through the plastic rear cover member 32. The flash sensing indicator 40 comprises an opaque non-reactive member 48 having apertures 50 provided therein, which are shown in FIG. 3. Each of the apertures 50 is in alignment with one of the windows 44 provided in the circuit board 38. The flash sensing indicator 40 further includes a generally flat radiation-sensitive means 52 which is affixed to one side of the opaque non-reactive member 48. The radiation-sensitive means 52 is located nearest the circuit board 38 and has sections 54 overlaying the apertures 50 provided in the nonreactive member 48 as shown in FIGS. 4 and 5. The radiation-sensitive means 52 is typically made of low temperature deformable thermoplastic, such as, polystyrene or polypropylene and has coated on one side thereof nearest the circuit board a dark-radiation-absorbing ink or other suitable means and on the other side thereof, a colored ink, such as light blue, for example, that is observable by the operator of the array. A typical thickness for the layer 52 is 0.015 in. Each of the overlaying radiation-sensitive sections 54 are operable to receive some of the radiant energy emitted by the flashing of one of the aligned lamps 12-19. The overlaying radiation-sensitive sections 54 are operable to constrict and change appearance upon being irradiated to provide an indicia of such flashing. For example, each radiation-sensitive section 54 colored light blue will upon the flashing of an aligned lamp, appear to the operator to become black. Actually, the overlaying section upon constriction moves away from the aperture giving the black appearance.

Preferably included on the circuit board 38 are fuses 45 covering a part of the windows 44. The fuses 45 are made of a thin conductive metallic strip so that upon flashing of a lamp, the corresponding fuse 45 will be impinged by heat radiaton of the flashed lamp and will burn through and thereby act as a safety to insure that the lamp is completely out of the sequencing circuitry 42. The inclusion of the fuses 45 in the circuit makes it especially desirable that the radiation-sensitive means 52 of the flash sensing indicator 40 be very sensitive to the radiation passing through window 44 because of the shielding action of the fuse 45. It has been discovered that when the overlaying radiation-sensitive sections 54 are each provided with a structurally-weakened portion 56 as shown in FIGS. 4 and 5 substantially traversing a lateral dimension of the section, upon irradiation by the flashing of one of the aligned lamps, the irradiated one of the overlaying radiation-sensitive sections 54 will readily separate at the structurally-weakened portion 56 to readily constrict upon itself to positively provide the desired change in appearance of the irradiated overlaying section. The structurally-weakened portion 56 can be made, for example, by cutting the overlaying section 54 with a sharp instrument. Preferably, each structurally-weakened portion 56 as shown in FIG. 4, should be perpendicular to the respective fuse 45 to expose as much of the structurally-weakened portion 56 as possible to the direct radiations emitted from the flashed lamp.

With the array 10 mounted in a camera socket using tab 24a, the array functions as follows: When the operator of the camera actuates the shutter, a voltage is applied across circuit branches 58, 58a, the voltage because of the design of the circuitry 42 is first applied to flash lamp 14 through lead-in conductors 22a, 22b. Immediately before the activation of the shutter, the overlaying radiation-sensitive sections 54 all appear to the observer as colored light blue and all the fuses 45 are intact. The circuitry 42 also preferably includes radiation-sensitive switches 60, 61, 62 comprising silver oxide and an organic polymer binder which upon receiving radiation from a flash lamp, changes from an open circuit or high resistance to a closed circuit or low resistance between its switch terminals on the circuit board 38. Accordingly, upon the flashing of lamp 14, switch 60 becomes conductive, the fuse 45 burns through, and the overlaying section 54 constricts, thereby giving the aperture labeled "1" in FIG. 3 a black appearance. Upon the next actuation of the shutter by the operator, lamp 15 is caused to fire because of switch 60 becoming conductive and the process is repeated as hereinbefore explained until lamp 12 is fired at which time the array must be turned end over end with tab 24b being mounted in the camera socket and the lamps 16-19 are ready to be flashed in the same sequential manner.

What is claimed is:

1. In combination with a flash lamp array including a plurality of flash lamps and sequencing electrical circuitry for sequentially flashing lamps, said array further including a two-sided circuit board having said sequencing circuitry affixed to one side thereof, said lamps positioned in close proximity to said one side of said circuit board, said circuit board provided with windows therethrough each in alignment with one of said lamps to permit the passage of radiant energy upon the flashing of each of said aligned lamps, the improvement which comprises:

a flash sensing indicator in close proximity to said other side of said circuit board and readily observable by an operator of said flash lamp array, said flash sensing indicator comprising an opaque non-reactive member having apertures provided therein each in alignment with one of said windows provided in said circuit board, said flash sensing indicator further including a generally flat radiation sensitive means affixed to one side of said opaque nonreactive member nearest said circuit board and having sections thereof overlaying said apertures provided in said nonreactive member, each of said overlaying radiation-sensitive sections operable to receive some of the radiant energy emitted by the flashing of one of said aligned lamps and operable to constrict and change appearance upon being irradiated to provide an indicia of such flashing, and said overlaying radiation-sensitive sections each provided with a structurally-weakened portion substantially traversing a lateral dimension of said overlaying radiation-sensitive sections so that upon irradiation by the flashing of one of said aligned lamps, the irradiated one of said overlaying radiation-sensitive sections will readily separate at said structurally-weakened portion to readily constrict upon itself to positively provide the desired change in appearance of said irradiated overlaying section.

2. The array of claim 1, wherein said generally flat radiation-sensitive means comprises a low temperature deformable thermoplastic.

3. The array of claim 2, wherein said low temperature deformable thermoplastic is polystyrene.

4. The array of claim 2, wherein said low temperature deformable thermoplastic on the one side thereof causes a coating of dark radiation absorbing ink.

5. The array of claim 4, wherein said low temperature deformable thermoplastic on the other side thereof carries a coating of colored ink.

6. The array of claim 1, wherein said sequencing circuitry includes radiation-sensitive switches.

7. The array of claim 1, wherein said sequencing circuitry includes fuses each covering a part of said apertures.

8. The array of claim 7, wherein said structurally-weakened portions of said overlaying sections are perpendicular to said fuses.

* * * * *